United States Patent [19]

Gibbs

[11] Patent Number: 5,666,069
[45] Date of Patent: Sep. 9, 1997

[54] DATA OUTPUT STAGE INCORPORATING AN INVERTING OPERATIONAL AMPLIFIER

[75] Inventor: Gary Austin Gibbs, San Jose, Calif.

[73] Assignee: Cypress Semiconductor Corp., San Jose, Calif.

[21] Appl. No.: 577,258

[22] Filed: Dec. 22, 1995

[51] Int. Cl.6 .................. H03K 19/0185; H03K 19/0948
[52] U.S. Cl. .................. 326/81; 326/33; 326/58; 326/83
[58] Field of Search .................. 326/80-81, 32-34, 326/57-58, 68, 83, 86, 121; 327/333, 313

[56] References Cited

U.S. PATENT DOCUMENTS

| | | |
|---|---|---|
| 4,412,347 | 10/1983 | Lipcon ........................ 455/58 |
| 4,555,642 | 11/1985 | Morales . |
| 4,763,021 | 8/1988 | Stickel . |
| 4,820,937 | 4/1989 | Hsieh . |
| 4,992,677 | 2/1991 | Ishibashi et al. ................ 326/86 |
| 5,166,558 | 11/1992 | Ohsawa ........................ 326/83 |
| 5,184,035 | 2/1993 | Sugibayashi .................. 326/33 |
| 5,206,550 | 4/1993 | Mehta . |
| 5,257,146 | 10/1993 | Price, Jr. et al. . |
| 5,280,200 | 1/1994 | Tarng . |
| 5,283,484 | 2/1994 | Brehmer et al. . |
| 5,296,760 | 3/1994 | Oertle et al. . |
| 5,371,552 | 12/1994 | Brummette et al. . |
| 5,382,917 | 1/1995 | Miyake et al. . |
| 5,384,503 | 1/1995 | Shu et al. . |
| 5,390,101 | 2/1995 | Brown . |
| 5,394,037 | 2/1995 | Josephson et al. . |
| 5,404,333 | 4/1995 | Mehta . |
| 5,418,482 | 5/1995 | Wong et al. . |
| 5,426,385 | 6/1995 | Lai . |
| 5,434,717 | 7/1995 | Yoshinaga et al. . |
| 5,438,287 | 8/1995 | Faue . |
| 5,453,704 | 9/1995 | Kawashima . |
| 5,528,172 | 6/1996 | Sundstrom .................. 326/58 |
| 5,541,534 | 7/1996 | Cao et al. .................. 326/83 |

OTHER PUBLICATIONS

Horenstein. *Microelectronic Circuits and Devices*. Prentice Hall, 1990. pp. 752-755.

*Primary Examiner*—David R. Hudspeth
*Assistant Examiner*—Jon Santamauro
*Attorney, Agent, or Firm*—Blakely, Sokoloff, Taylor & Zafman, LLP

[57] ABSTRACT

A voltage output clamp circuit includes a reference voltage generator, a switched differential operational amplifier, and an output driver circuit. The reference voltage generator has a first input coupled to a first reference voltage and a second input coupled to a second reference voltage. An output of the reference voltage generator is coupled to a first input of the switched differential operational amplifier. The output of the operational amplifier is coupled to an input of the output driver circuit and an output of the output driver circuit is coupled to a second input of the operational amplifier, providing a feedback path. The voltage output clamp circuit may further include a first NAND gate receiving a first logical signal and an output enable signal and providing an output. The output of the first NAND gate may be coupled to an input of a first transistor which is arranged to provide an electrical path between the first reference voltage and the operational amplifier. The voltage output clamp may further have a second NAND gate which receives a second logical signal and the output enable signal. An output of the second NAND gate is coupled to the output driver circuit.

14 Claims, 7 Drawing Sheets

DATA OUTPUT STAGE INCORPORATING AN INVERTING OPERATIONAL AMPLIFIER

BACKGROUND OF INVENTION

I. Field of Invention

The present invention relates generally to interface circuits, and more particularly in one embodiment to a data output stage that is integrated into a memory chip.

II. Prior Art

FIG. 1 illustrates a prior art output stage implemented using CMOS technology. A NAND gate 3 has a first input for receiving an output enable (OE) signal and a second input for receiving a true (IN) signal. The NAND gate 3 generates a logical low when the OE signal is asserted high and IN is asserted high. A NAND gate 5 has a first input for receiving the output enable (OE) signal and a second input for receiving a complement signal ($\overline{IN}$). The differential inputs (the IN and the $\overline{IN}$ signals) are generated by a functional circuit (e.g., the bitlines from a memory). The NAND gate 5 generates the inverted logical state of the $\overline{IN}$ signal when the OE signal is asserted (e.g., when the $\overline{IN}$ signal is asserted, the output of NAND gate 5 is a logical low).

A first inverter 7 and a second inverter 9 are coupled to the NAND gate 3 and the NAND gate 5, respectively. Each of the inverters has inputs to receive power signals (i.e., $V_{cc}$ and $V_{ss}$ (e.g., ground)). These inverters 7 and 9 invert the output of the NAND gate 3 and the NAND gate 5 and also provide gain for the signal passing through the inverters.

A first NMOS transistor 11 and a second NMOS transistor 13 are coupled to the first inverter 7 and the second inverter 9, respectively. The NMOS transistors 11 and 13 are coupled to each other in series to form an output stage for generating $V_{out}$. The first NMOS transistor 11 is known in the art as a "pull-up" transistor for bringing $V_{out}$ to the power rail ($V_{cc}$) minus one threshold voltage ($V_{TH}$). Similarly, the NMOS transistor 13 is known in the art as a "pull-down" transistor for pulling $V_{out}$ to $V_{ss}$ (e.g., ground).

FIG. 2 illustrates the transistor implementation of the first and second inverters 7 and 9. As is well known in the art, an inverter may be implemented using a PMOS transistor 15 coupled in series to an NMOS transistor 17 with the gates of the NMOS and the PMOS transistors coupled together. The first and second inverters 7 and 9 comprise the gain stage of this circuit.

In an alternative prior art approach, a pass transistor is employed to clamp the output voltage. This pass transistor in effect clamps the output high voltage ($V_{OH}$) to approximately one threshold voltage ($V_{TH}$) below the power supply voltage ($V_{cc}$) (i.e., $V_{OH}$ equals $V_{cc}$ minus $V_{TH}$).

As computer components and systems transition to lower voltages (e.g., 5 V to 3.3 V), there is a need for interface circuitry to interface a component operating with the 5 volt power supply to a circuit component operating with a 3.3 V voltage supply.

The prior art interface circuits have the following disadvantages. First, these prior art interface circuits are susceptible to process temperature and voltage variations. In other words, the performance of the interface circuit varies widely and depends upon the type of process used to manufacture the component, and the temperature and voltage at which the component is operating. Accordingly, when a system designer is incorporating the interface circuit into his design, he cannot be assured of meeting voltage specifications because of the widely divergent and varying results that stem from process differences, temperature and voltage range discrepancies.

For example, a change of one volt in the power supply voltage generally corresponds to a one volt change on the output of the interface circuit. When designing in a computer system having all components operating with a 5 V power supply, this performance dependency on power supply voltage fluctuations is not as significant as in a lower power system because the $V_{OH(max)}$ (the maximum output high voltage) necessary for the proper operation of all the circuits is not specified for in a 5 V power supply system. However, when the receiving component has a 3.3 V power supply, the $V_{OH\ (max)}$ (voltage output high) is specified. Accordingly, a signal provided to a 3.3 V circuit component must meet more stringent voltage requirements than a signal provided to a 5 V computer part.

Accordingly, it is evident that it would be desirable to have an interface data output clamp for interfacing a 5 V component to a 3.3 V component. Moreover, it would be desirable that the performance of this data output stage is not as sensitive to fluctuations in the power supply voltage as prior art data outputs.

SUMMARY OF THE INVENTION

The present invention provides an improved data output clamp. In a preferred embodiment, the data output clamp is designed to interface a 5 volt component to a 3.3 volt component.

The present invention employs a switched differential operational amplifier interposed between an output driver and a voltage reference generator. The output stage includes a first and second NMOS transistor connected in series (i.e., the source of the first transistor is coupled to the drain of the second transistor). This series connection is also coupled to an output port. The first transistor is used to "pull-up" the output port ($V_{out}$) to the reference voltage, which in one embodiment is approximately equal to 60% of $V_{cc}$. The second transistor in the output stage is used to "pull-down" the output port ($V_{out}$) to ground ($V_{ss}$). The switched differential operational amplifier has a non-inverting input, and inverting input for receiving voltages, and an output. This amplifier is employed to provide the "clamping" effect of the present invention.

The output of the operational amplifier is coupled to the gate of the first transistor of the output stage. The non-inverting input of the operational amplifiers is coupled to a voltage reference generator that generates a reference voltage (i.e., a clamping voltage). The inverting input of the operational amplifier is coupled to the source (i.e., the output port ($V_{out}$)) of the first transistor in the output stage. In other words, the present invention provides a feedback path to couple the output port ($V_{out}$) to the inverting input of the amplifier.

It is preferable to have an electrostatic protection device (ESD), such as a resistor, coupled between the source ($V_{out}$) of the first transistor of the output stage and the inverting input of the operational amplifier. The output of the operational amplifier is also coupled to $V_{ss}$ via a third transistor.

The operational amplifier receives its power supply voltage from $V_{cc}$ via a fourth transistor. The gates of the third and fourth transistors are coupled to each other and also to an output of a NAND gate. This NAND gate has a first input for receiving a true signal (IN) and a second input for receiving an output enable signal (OE).

The present invention also includes a second NAND gate having a first input for receiving the output enable signal and a second input for receiving a complement input signal ($\overline{IN}$). The output of the second NAND gate is coupled to the input of an inverter. The output of the inverter is coupled to the gate of the "pull-down" transistor (i.e., the second transistor in the output stage).

BRIEF DESCRIPTION OF THE DRAWINGS

The present invention is illustrated by way of example and not limitation in the figures of the accompanying drawings in which like references indicate similar elements.

FIG. 6b illustrates in greater detail the load device of FIG. 6a.

DETAILED DESCRIPTION OF THE INVENTION

The present invention is a novel, high-performance data output clamp capable of operating reliably and having a stable output over temperature and process fluctuations, as well as variations in the power supply voltage. In the following description numerous, specific details are set forth, such as logic gates, transistor types and sizes, etc. in order to provide a thorough understanding of the present invention. However, it will be obvious to one skilled in the art that the present invention may be practiced without the specific details. In other instances, well-known circuit design principles have not been set forth in detail in order to not unnecessarily obscure the present invention.

Although embodiments of the present invention are described in terms of Metal Oxide Semiconductor (MOS) transistors (i.e., p-channel and n-channel devices), it will be evident by those skilled in the art that the present invention may be implemented with different process technologies and different semiconductor devices. Specifically, it will be understood by those skilled in the art that a transistor has a first electrode, a second electrode, and a third electrode. The first electrode may be a source or a drain depending on the type of transistor employed. The second electrode is a drain or source, whichever the first electrode is not. The third electrode is a gate of the transistor that is employed to control the amount of current flowing through the transistor. The first and second electrodes form a current path for the transistor. In art NMOS transistor current flows from the drain to the source, whereas in a PMOS transistor, the current flows from the source to the drain.

It will also be evident to those skilled in the art that the first electrode and the second electrode may be a collector or an emitter, and the third electrode may be a base in a bipolar transistor. The collector and emitter in a bipolar transistor perform essentially the same function as the drain and source in a MOS transistor. Specifically, the collector and emitter form a current path for the bipolar transistor, and the base is employed to control the amount of current flowing through the current path.

Figure 1:
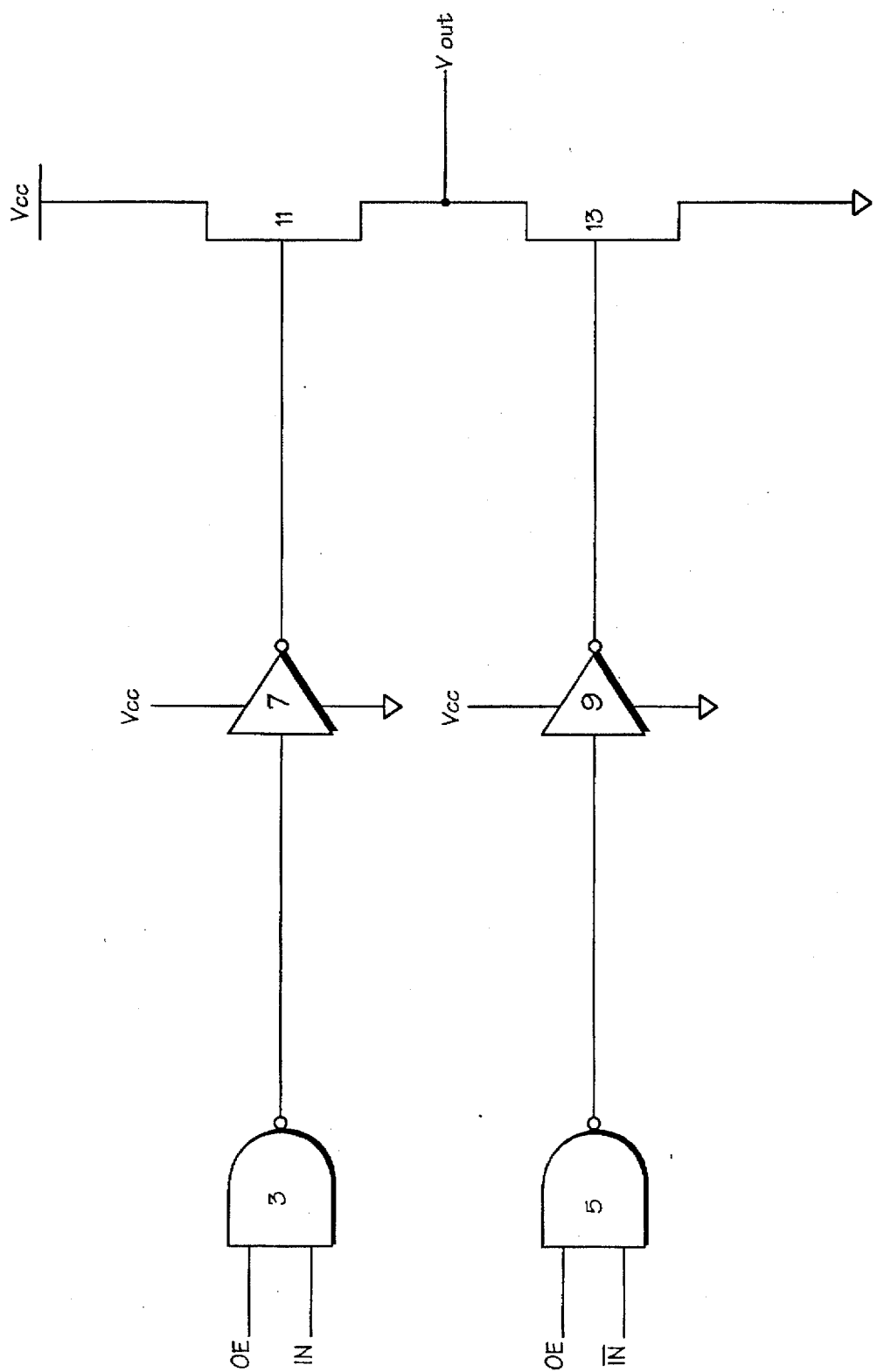
FIG. 1 illustrates a prior art data output clamp.
Figure 2:
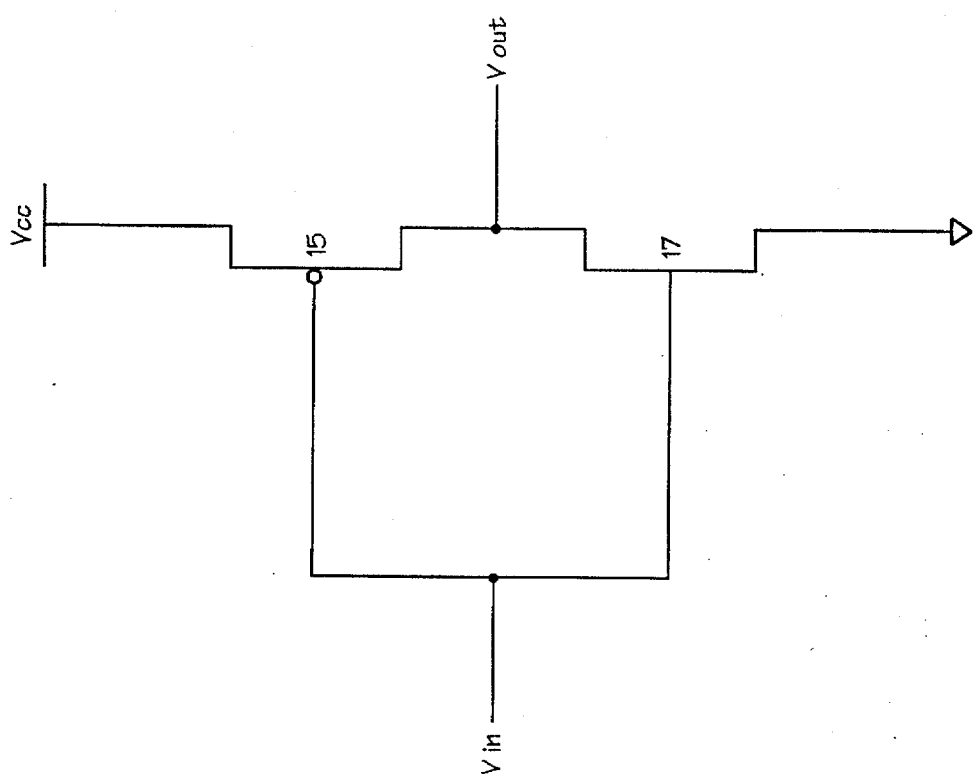
FIG. 2 illustrates a prior art inverter.
Figure 3A:
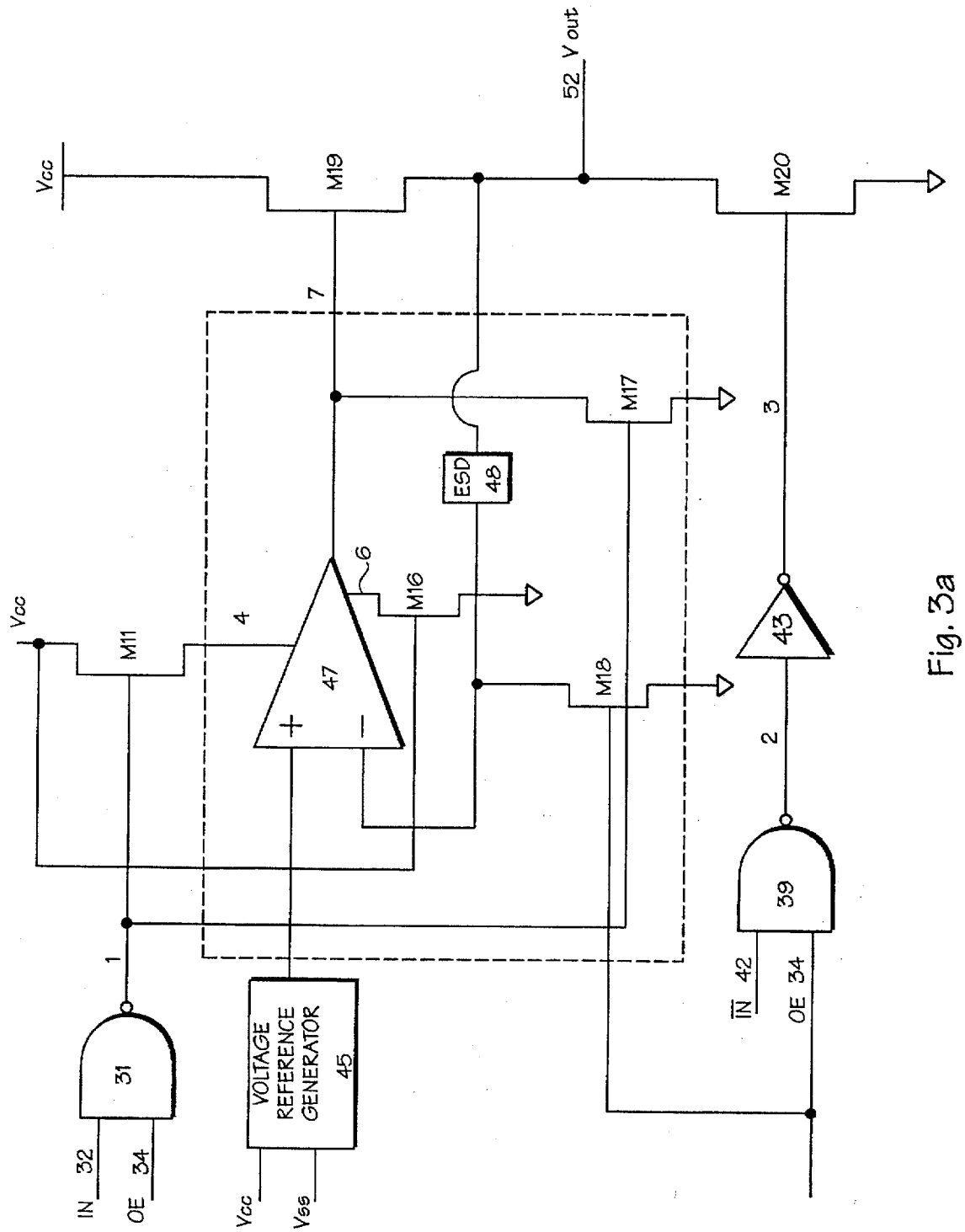
FIG. 3a illustrates the data output clamp of the present invention.

The present invention is a novel, high-performance Complementary Metal Oxide Semiconductor (CMOS) data output stage as shown in FIG. 3a. The present invention is used to drive data from one semiconductor device, operating at a first reference voltage, such as a SRAM (static random access memory), to another semiconductor device, operating at a different reference voltage, such as a microprocessor. The present invention receives a true logical signal (IN) 32 and its complement ($\overline{IN}$) 42. The present invention amplifies (i.e., increases the current of) the input signals and generates a voltage output ($V_{out}$) at the $V_{out}$ port 52.

The present invention generates at the output port ($V_{out}$) 52 an output signal that has a voltage level greater than 2.4 volts and less than 3.435 volts for a logical high IN signal and a voltage level less than 0.4 volts for a logical low IN signal. Specifically, the voltage output clamp of the present invention generates a signal at the output port that substantially matches the reference voltage signal. The present invention faithfully provides the desired output over a wide temperature range i.e., from −55° C. to 125° C.), process variations, and also changes to the power supply voltage without suffering any performance loss relative to the prior art.

Figure 3B:
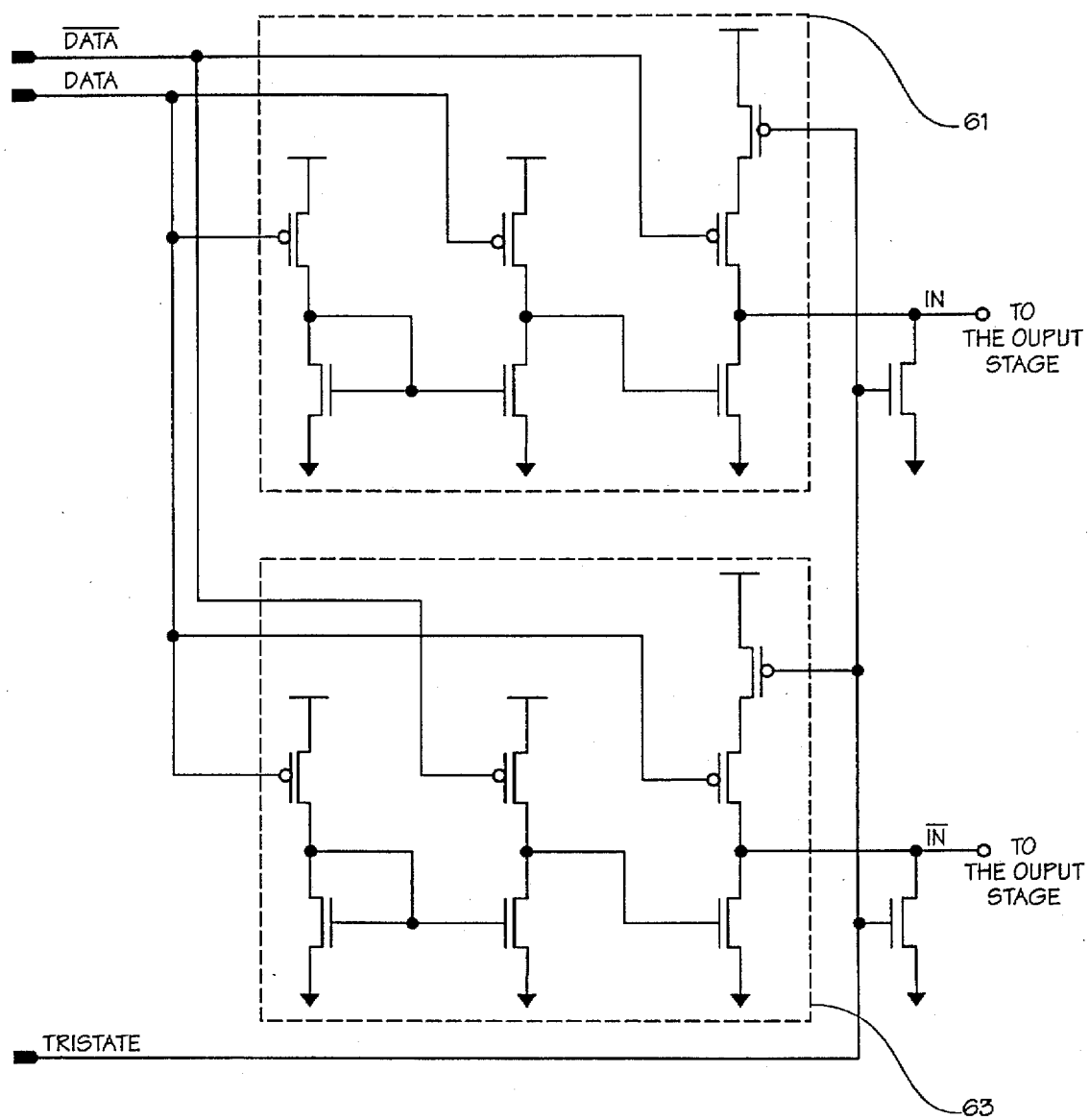
FIG. 3b illustrates the pre-amplification circuits that are coupled to the present invention.

The present invention is typically used to drive a single bit of data out from an SRAM operating at a first reference voltage (e.g., 5 V) to a microprocessor operating at a different reference voltage (e.g., 3.3 V). As noted previously, the data output stage of the present invention receives the data, and its complement, in the form of the IN signal 32 and the $\overline{IN}$ signal 42, respectively. In a normal implementation, the present invention receives the IN and $\overline{IN}$ signals from pre-amplification circuits 61 and 63 as illustrated in FIG. 3b. The pre-amplification circuits 61 and 63 amplify the data signal to be driven (and its complement) so that it can drive the present invention.

In a typical computer system, $V_{out}$s of different semiconductor chips would be coupled together to a single pin of a microprocessor. In this way, multiple SRAMs can supply a single microprocessor with data. The $V_{out}$ signals of different devices are multiplexed together so that only one semiconductor device can supply a signal to the microprocessor at any one time. While one semiconductor device is supplying data to the microprocessor, the other semiconductor devices are disabled or in a high impedance state.

The present invention includes a first NAND gate 31 having a first input for receiving the IN signal 32 and a second input for receiving the output enable (OE) signal 34. The output of the NAND gate 31 is coupled to the gate of transistor M11 that provides a path to the first reference voltage (e.g., $V_{cc}$) for a switched differential operational amplifier 47, which will be discussed in detail hereinafter.

The present invention also includes a second NAND gate 39 having a first input for receiving the $\overline{IN}$ signal 42 and a second input for receiving the output enable (OE) signal 34. The output of the second NAND gate 39 is coupled to an input of an inverter 43. The output of the inverter 43 is coupled to a "pull-down" transistor M20 of the output stage.

The present invention also includes a voltage reference generator 45 for receiving $V_{cc}$ and a second reference voltage (e.g., $V_{ss}$) and generating a reference voltage signal. The voltage reference generator 45 is coupled to the operational amplifier 47 and supplies the non-inverting input of the switched differential operational amplifier 47 with the reference voltage (e.g., 60% of $V_{cc}$). The details of the voltage reference generator 47 will be described hereinafter.

The switched differential operational amplifier 47 that utilizes feedback is at the core of the present invention. The switched differential operational amplifier 47 has a non-inverting input coupled to the voltage reference generator 45 and an inverting input coupled to the $V_{out}$ port 52. The connection between the $V_{out}$ port 52 and the non-inverting input of the operational amplifier 47 provides feedback to the operational amplifier. The inverting input of the operational amplifier 47 is coupled to the second reference voltage (e.g., $V_{ss}$, which is usually ground) via transistor M18 in order to keep transistor M19 out of saturation. The gate of transistor M18 receives the OE signal 34. In a preferred embodiment, it is desirable to have an electrostatic protection device (ESD) 48, such as a resistor, coupled between the $V_{out}$ port 52 and the inverting input of the operational amplifier 47. As mentioned previously, the operational amplifier 47 receives the first reference voltage through transistor M11. The operational amplifier 47 is also coupled to the second reference voltage through transistor M16. The output of the operational amplifier 47 is coupled to the gate of transistor M19. Transistor M19 is coupled to the first reference voltage and the $V_{out}$ port 52.

Figure 4:
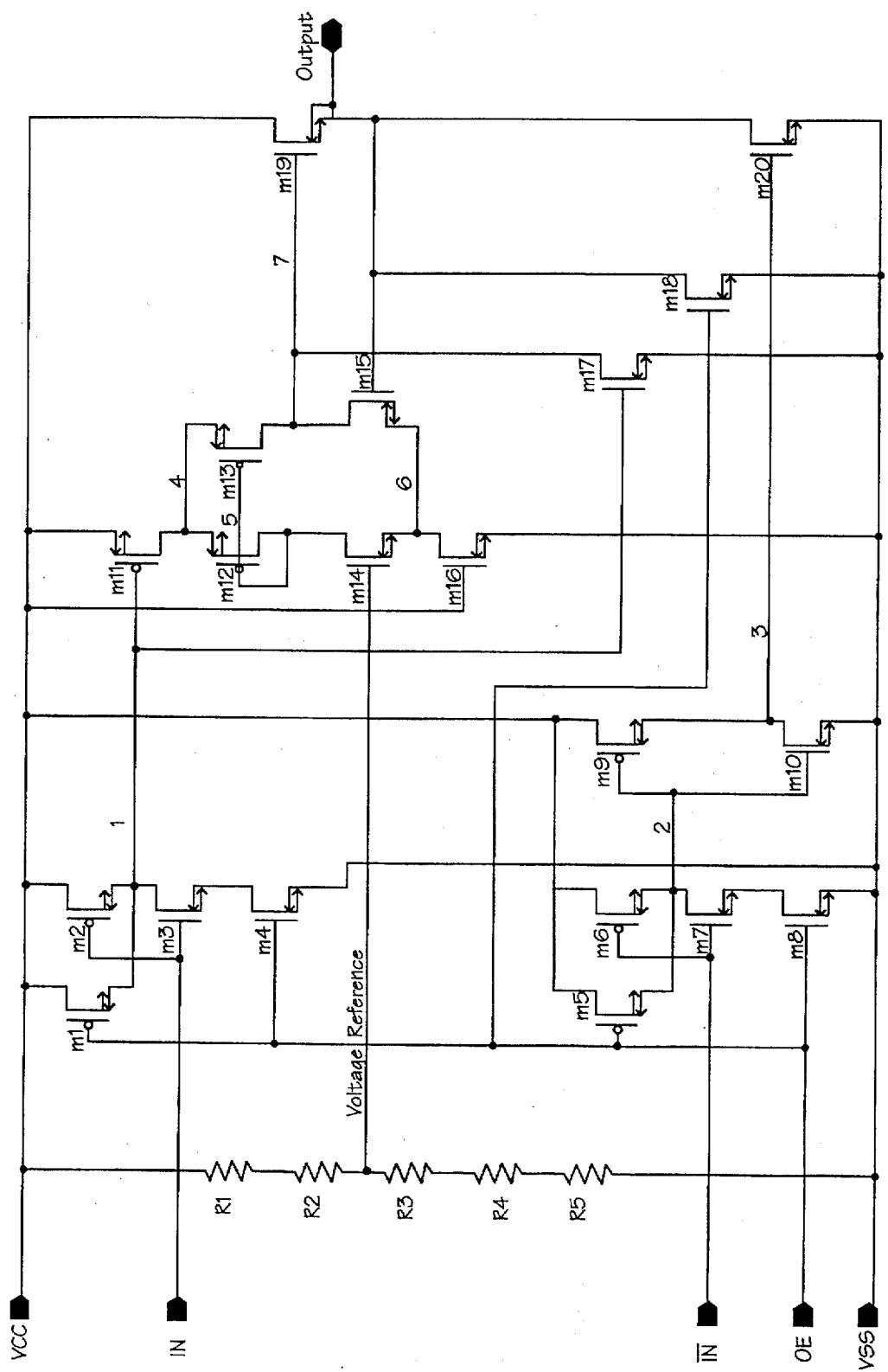
FIG. 4 illustrates a circuit diagram showing additional details of the data output clamp of the present invention.

FIG. 4 illustrates in greater detail the circuit components of the present invention. When the OE signal 34 is not asserted, the $V_{out}$ node 52 is high impedance. When the OE signal 34 is asserted, the $V_{out}$ node 52 may be a valid high or a valid low, depending on the IN signal 32 and $\overline{IN}$ signal 42.

The first NAND gate 31 includes two PMOS (P channel) transistors (M1 and M2) that are connected in parallel. The source of transistor M1 and the source of transistor M2 are coupled together and to $V_{cc}$. The drain of transistor M1 and the drain of transistor M2 are coupled together and to node 1. The gate of transistor M1 receives the OE signal 34, and the gate of the second PMOS transistor M2 receives the IN signal 32. Transistor M3 and transistor M4 are coupled in series with transistor M2. Both transistors M3 and M4 are NMOS (N channel) transistors. The output of the first NAND gate 31 (Node 1) is coupled to the sources of transistors M1 and M2 and also to the drain of transistor M3. Node 1 is also coupled to the gate of a PMOS transistor M11 and also to the gate of an NMOS transistor M17.

Transistor M11 couples the differential operational amplifier 47 to $V_{cc}$ and selectively enables the differential operational amplifier 47 in response to the voltage signal at node 1. The output of the first NAND gate 31 determines whether or not transistor M11 is turned on and, subsequently, whether or not the differential operational amplifier 47 is enabled.

Transistor E17 couples the output of the operational amplifier 47 (node 7) to the second reference voltage (e.g., $V_{ss}$). Transistor M17 selectively disables the operational amplifier (i.e., makes the output (node 7) of the operational amplifier 47 close to $V_{ss}$) when transistor M17 is operating. Node 7 is coupled to the gate of the transistor M19, which is the "pull-up" transistor of the output driver stage. As noted previously, the $V_{out}$ node 52 is coupled to the inverting input of the operational amplifier 47, typically through an ESD (electrostatic device), such as a resistor. The coupling of the $V_{out}$ node to the inverting input of the operational amplifier provides feedback to the operational amplifier 47.

The non-inverting input of the operational amplifier is coupled to the voltage reference node. The voltage reference is coupled to the output of the reference voltage generator 45 that provides a reference voltage. In this embodiment, the voltage generator includes a voltage divider circuit formed with five resistors. Table 1 illustrates one set of possible values for these resistors ($R_1$ through $R_5$). It will be understood to one skilled in the art that other means may be used to generate a reference voltage (e.g., a bandgap regulator). These alternative reference voltage generation means are well-known in the art.

The second NAND gate 39 includes transistors M5 and M6 coupled in parallel. Transistor M5 is a PMOS device that has a gate for receiving the OE signal 34. The transistor M6 is also a PMOS device that has its gate coupled to the $\overline{IN}$ signal. The source of transistor M5 and the source of transistor M6 are coupled together and to $V_{cc}$. The drain of transistor M5 and the drain of transistor M6 are coupled together and to node 2. The drain of transistor M6 is coupled in series with transistor M7 and transistor M8. The gate of transistor M7 receives the $\overline{IN}$ signal 42, and the gate of the M8 transistor receives the OE signal 34. The output of the NAND gate is at node 2. Node 2 is coupled to an inverter 43 that includes a PMOS transistor M9 and an NMOS transistor M10 coupled in series. This inverter provides gain to the output transistor M20 and also inverts the signal from the second NAND gate 39. The output of the inverter (node 3) is coupled to the gate of the transistor M20 (the pull-down transistor of the output driver stage).

TABLE I

| Register | Value |
| --- | --- |
| R1 | 1K ± 10% |
| R2 | 1K ± 10% |
| R3 | 1K ± 10% |
| R4 | 1K ± 10% |
| R5 | 1K ± 10% |

In summary, the reference generator 45, in this case a resistor network, generates an internal reference voltage (e.g., a voltage approximately equal to 60% of $V_{cc}$) which is used as an input reference voltage to the non-inverting side of the switched differential operational amplifier 47. Table I illustrates exemplary resistor values for the resistors R1–R5 in the resistor network that generates an approximate internal reference voltage approximately equal to 60% of $V_{cc}$. This reference generator 45 attenuates the variation of the power supply of voltage by ah approximate factor of 0.6. For example, if the power supply voltage changes by 1 volt, the reference voltage only changes by 0.6 volts.

The differential operational amplifier 47 is current limited by the grounded NMOS transistor M16, and switched on by the upper PMOS transistor M15. The output of the operational amplifier drives the gate of the output NMOS source follower M19, and the output of the NMOS source follower is fed back to the inverting side of the operational amplifier. The source follower M19 drives the output port $V_{out}$ until it matches the reference voltage.

The operational amplifier 47 further includes a first NMOS transistor M14 having a gate coupled to the voltage reference node, and an NEOS transistor M15 having its gate coupled to the $V_{out}$ port 52 through an ESD device. The transistor M14 is coupled in series to another NMOS transistor M16. Transistor M16, which limits the current through the operational amplifier has its gate coupled to $V_{cc}$ and its source coupled to $V_{ss}$ (e.g., ground). The operational amplifier 47 further includes a current mirror formed by transistors M12 and M13. Transistor M12 has its gate and drain coupled together. The gates of transistor M12 and M13 are also coupled together. Both of these devices, M12 and M13, are PMOS devices. The sources of M12 and M13 are coupled together and also coupled to the drain of transistor M11 (at node 4).

Table II illustrates exemplary W values for the transistors employed in the present invention. W represents the width of the gate of the transistor in question. In a preferred embodiment, the process used to manufacture the transistors used in the present invention is a 0.5 microns (um) process. Accordingly, the L values that represent the length of the gate of the transistors, are equal to 0.5 microns (um) for all the transistors in Table II unless noted otherwise (e.g., transistor M18 which has a L of 2 um). The W values illustrated in Table II are exemplary values that may be appropriate for certain applications.

TABLE II

| Transistor | W |
| --- | --- |
| M1 | 24 |
| M2 | 24 |
| M3 | 24 |
| M4 | 24 |
| M5 | 8 |
| M6 | 8 |
| M7 | 4 |
| M8 | 4 |
| M9 | 8 |
| M10 | 8 |
| M11 | 64 |
| M12 | 16 |
| M13 | 64 |
| M14 | 8 |
| M15 | 32 |
| M16 | 4 |
| M17 | 10 |
| M18 | 1.7/2 |
| M19 | 256 |
| M20 | 256 |

Figure 5:
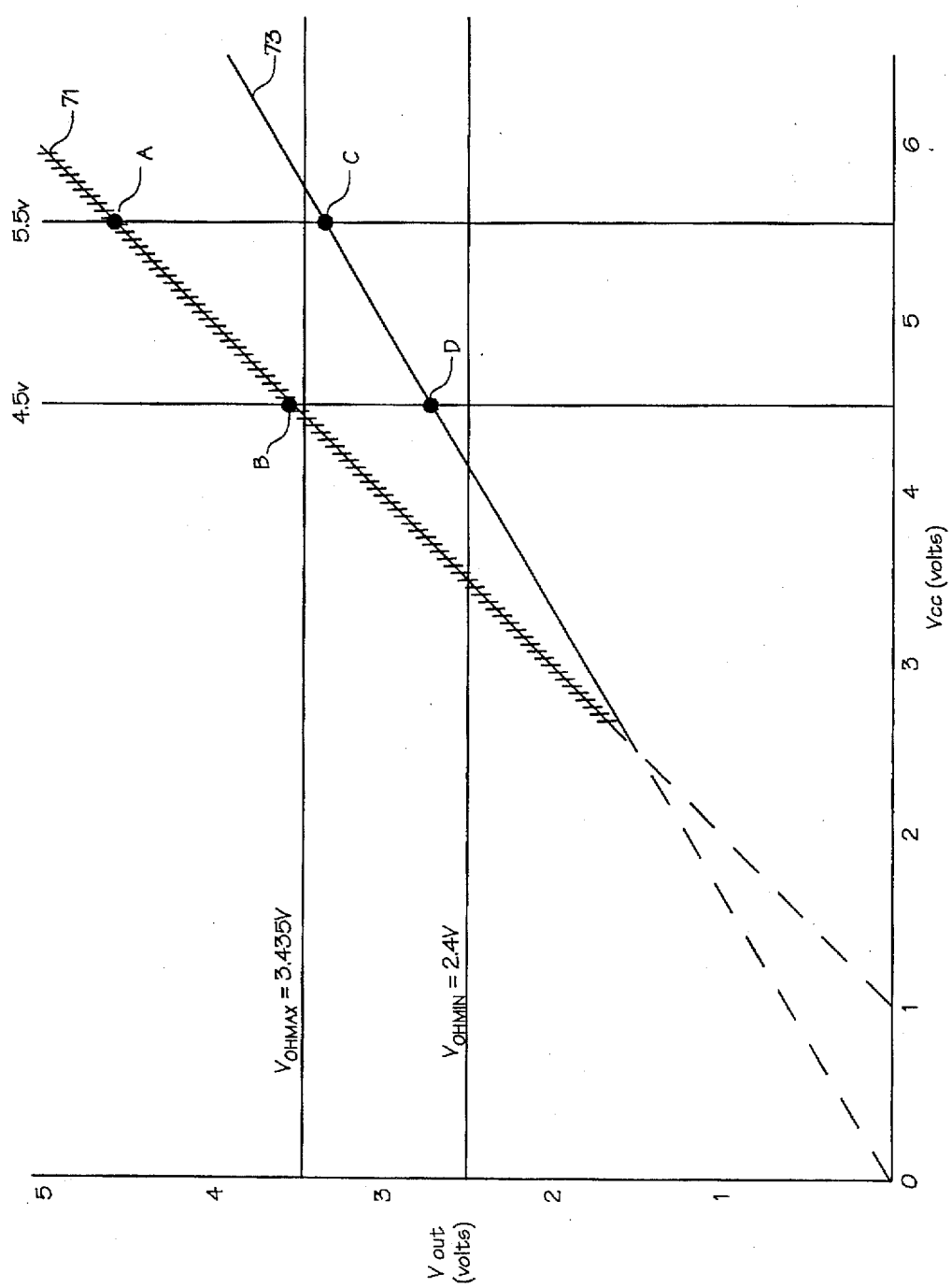
FIG. 5 illustrates a graph of the $V_{out}$ versus $V_{cc}$ that compares a prior art data output clamp with the data output clamp of the present invention.

FIG. 5 illustrates a graph of the output voltage ($V_{out}$) versus the power supply voltage ($V_{cc}$) for one embodiment of the present invention line 71 illustrates a line describing the relationship between $V_{out}$ and $V_{cc}$ for prior art data output clamps. As can be seen, the performance characteristics of the prior art devices do not meet the specifications for interfacing to low power devices (i.e., 3.3 V parts), where the $V_{OHmax}$ equals 3.435 V and the $V_{OHmin}$ equals 2.4 V. Specifically, $V_{out}$ at 4.5 V (point A) and at 5.5 V (point B) are both greater than $V_{OHmax}$. The prior art devices do not meet this criteria even without considering process and temperature variation/effaces. In contrast, the present invention meets the criteria noted above even when process and temperature effects are taken into account. Line 73 approximates the relationship between $V_{out}$ and $V_{cc}$ as exhibited by the present invention.

Specifically, as can be seen in FIG. 5, in the power supply voltage range in question (i.e., 5 volts ±10%, which translates into a range of 4.5 volts to 5.5 volts), the present invention, having the characteristics approximated by line 73, meets the requirements (see point C and point D), as set forth above. For example, at 5.5 V, the $V_{out}$ of the present invention (point C) is below $V_{OHmax}$. Clearly, the prior art circuit, represented by line 71, does not meet the output requirements (i.e., $V_{OHmax}$=3.435 V). $V_{OHmax}$ is important when a 5 V ±10% part drives a 3.3 V ±5% part. Moreover, the present invention, represented by line 73, does meet the output requirements (i.e., $V_{OHmax}$=3.435 V) for a 5 V ±10% part driving a 3.3 V ±5% part. Because the present invention has gain in the feedback amplifier, the variation due to process/temperature is negligible (line 73), whereas the prior art device (line 71) exhibits process/temperature dependence of approximately ±50 mV.

Figure 6A:
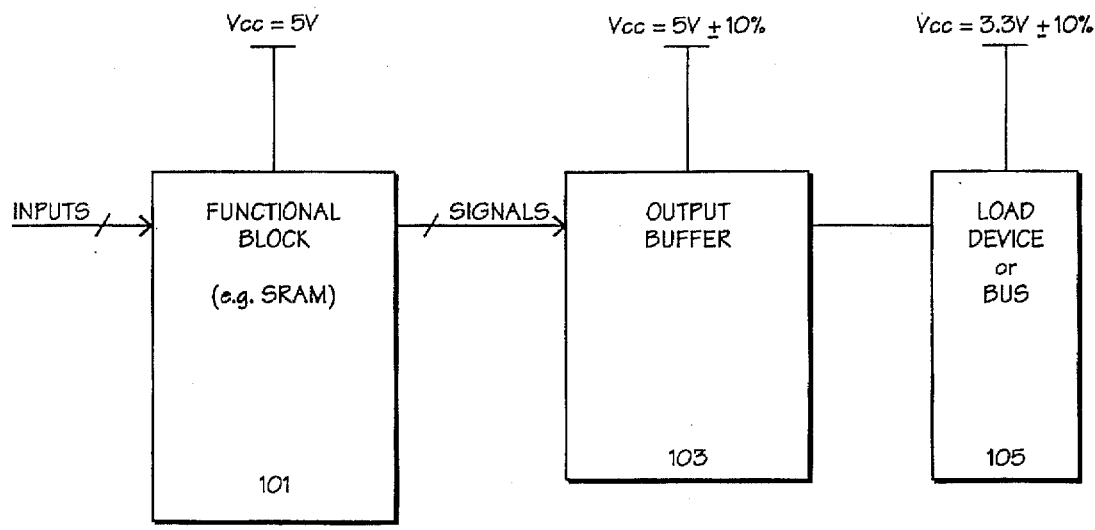
FIG. 6a illustrates a computer system in which the present invention may be implemented.

FIG. 6a illustrates an exemplary embodiment of the present invention in a computer system. This computer system includes a functional block 101, which may be a static RAM chip. This functional block has a plurality of inputs and also a plurality of functional outputs. The computer system also includes an output buffer 103 that receives the outputs from the functional block 101 and generates outputs to a load device or bus 105. As will be noted, the functional block 101 and the output buffer 103 are both coupled to a 5 V ±10% power supply, whereas the load device/bus 105 is coupled to a 3.3 V ±5% power supply.

Figure 6B:
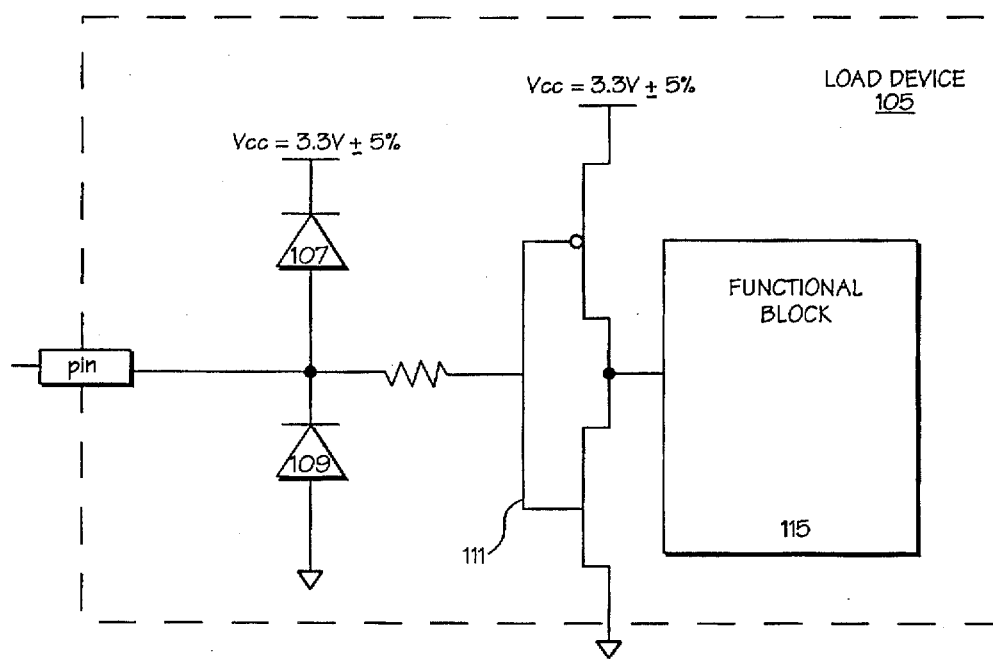

FIG. 6b also illustrates in greater detail the load device 105 of the preferred embodiment of the present invention. In the preferred embodiment, the load device 105 is a microprocessor chip. The chip has a pin through which the signals generated from the output buffer 103 are passed into the processor. A plurality of protection diodes 107 and 109 are used as ESD devices. Typically, there is also a resistor coupling the pin to an inverter stage 111. The signal is then passed through the functional block 115 of the processor 105. As can be seen from FIG. 6b, this part is a 3.3 V ±5% part. The present invention is implemented in the output buffer 103 and provides the interface between a 5 volt computer component and a 3.3 volt computer component.

In the foregoing specification, the invention has been described with reference to specific exemplary embodiments thereof. It will however be evident that various modifications and changes may be made thereto without departing from the broader spirit and scope of the invention as set forth in the appended claims. The specification and drawings are accordingly to be regarded as illustrative rather than restrictive.

What is claimed is:

1. A voltage output clamp comprising:
   a reference voltage generator circuit having a first input coupled to a first reference voltage, a second input coupled to a second reference voltage and an output;
   a switched differential operational amplifier, having a first input coupled to the output of the reference voltage generator circuit, a second input, and an output;
   an output driver circuit having a first input coupled to the output of the switched differential operational amplifier and an output coupled to the second input of the switched differential operational amplifier;
   a first NAND gate having a first input receiving a first logical signal, a second input receiving an output enable signal, and an output; and
   a first transistor arranged to provide an electrical path between the first reference voltage and the switched differential operational amplifier, and being coupled to the output of the first NAND gate.

2. The voltage output clamp as set forth in claim 1, further comprising a second NAND gate having a first input receiving a second logical signal, a second input receiving the output enable signal; and an output coupled to the output driver circuit.

3. The voltage output clamp as set forth in claim 2, further comprising a second transistor having a first electrode coupled to the second input of the switched differential operational amplifier, a second electrode coupled to the second reference voltage, and a third electrode receiving the output enable signal.

4. The voltage output clamp as set forth in claim 3, wherein said switched differential operational amplifier comprises;
   a thirst transistor having a first electrode, a second electrode, and a third electrode;

a fourth transistor having a first electrode coupled to the first electrode of the third transistor, a second electrode, and a third electrode coupled to the third electrode of the third transistor;

a fifth transistor having a first electrode coupled to the second electrode of the third transistor, a second electrode, and a third electrode coupled to the output of the reference voltage generator;

a sixth transistor having a first electrode coupled to the second electrode of the fifth transistor, a second electrode coupled to the second reference voltage, and a third electrode coupled to the first reference voltage; and a seventh transistor having a first electrode coupled to the second electrode of the fourth transistor, a second electrode coupled to the second electrode of the fifth transistor, and a third electrode coupled to the output driver circuit.

5. The voltage output clamp as set forth in claim 4, wherein the first NAND gate further includes an eighth transistor having a first electrode coupled to the first reference voltage, a second electrode, and a third electrode receiving the output enable signal;

a ninth transistor having a first electrode coupled to the first reference voltage, a second electrode coupled to the second electrode of the eighth transistor, and a third electrode receiving the first logical signal;

a tenth transistor having a first electrode coupled to the second electrode of the ninth transistor, a second electrode, and a third electrode coupled to the third electrode of the ninth transistor, a second electrode, and a third electrode coupled to the third electrode of the ninth transistor and receiving the first logical signal;

an eleventh transistor having a first electrode coupled to the second electrode of the tenth transistor, a second electrode coupled to the second reference voltage, and a third electrode coupled to the third electrode of the eighth transistor and receiving the output enable signal.

6. The voltage output clamp as set forth in claim 5, wherein the second the second NAND gate further includes a twelfth transistor having a first electrode coupled to the first reference voltage, a second electrode, and a third electrode coupled to the third electrode of the eighth transistor and receiving the output enable signal;

a thirteenth transistor having a first electrode coupled to the first electrode of the twelfth transistor and the first reference voltage, a second electrode coupled to the second electrode of the twelfth transistor, and a third electrode receiving the output enable signal;

a fourteenth transistor having a first electrode coupled to the second electrode of the thirteenth transistor, a second electrode, and a third electrode coupled to the third electrode of the thirteenth transistor;

a fifteenth transistor having a first electrode coupled to the second electrode of the fourteenth transistor, a second electrode coupled to the second reference voltage, and a third electrode coupled to the third electrode of the eighth transistor.

7. The voltage output clamp as set forth in claim 6, wherein the second NAND gate is coupled to the output driver circuit through an inverter having a sixteenth transistor including a first electrode coupled to the first reference voltage, a second electrode, and a third electrode coupled to the second electrode of the twelfth transistor; and a seventeenth transistor having a first electrode coupled to the second electrode of the sixteenth transistor, a second electrode coupled to the second reference voltage, and a third electrode coupled to the third electrode of the sixteenth transistor.

8. The voltage output clamp as set forth in claim 7, wherein the sixteenth transistor is a PMOS transistor and the seventeenth transistor is an NMOS transistor.

9. The voltage output clamp as set forth in claim 8, wherein the eighth transistor and the ninth transistor are both PMOS transistors and the tenth and eleventh transistors are NMOS transistors.

10. The voltage output clamp as set forth in claim 9, wherein the twelfth transistor and the thirteenth transistor are both PMOS transistors and the fourteenth transistor and the fifteenth transistor are both NMOS transistors.

11. The voltage output clamp as set forth in claim 10, wherein the third transistor and the fourth transistor are both PMOS transistors and the fifth, sixth and seventh transistors are NMOS transistors.

12. The voltage output clamp as set forth in claim 11, wherein the output driver circuit includes an eighteenth transistor having a first electrode coupled to the first reference voltage, a second electrode coupled to the output of said differential operational amplifier and a third electrode coupled to the output of said output driver circuit, and a nineteenth transistor having a first electrode coupled to the second reference voltage, a second electrode coupled to said inverter and a third electrode coupled to said output of said output driver circuit.

13. The voltage output clamp as set forth in claim 1 and comprising an output circuit of a synchronous random access memory (SRAM) chip operating at the first reference voltage.

14. The voltage output clamp as set forth in claim 1, wherein the output of the output driver circuit is coupled to a processor.

* * * * *

UNITED STATES PATENT AND TRADEMARK OFFICE
CERTIFICATE OF CORRECTION

| | | |
|---|---|---|
| PATENT NO. | : | 5,666,069 |
| DATED | : | September 9, 1997 |
| INVENTOR(S) | : | Gary A. Gibbs |

It is certified that error appears in the above-identified patent and that said Letters Patent is hereby corrected as shown below:

In the Title Page at [57] at line 17 delete "damp" and insert --clamp--

In column 3 at line 58 delete "art" and insert --an--

In column 7 at line 46 delete "effaces" and insert --effects--

In column 8 at line 66 delete "thirst" and insert --third--

Signed and Sealed this

Thirteenth Day of January, 1998

Attest:

BRUCE LEHMAN

*Attesting Officer*     *Commissioner of Patents and Trademarks*